United States Patent
Li et al.

(10) Patent No.: US 11,282,868 B2
(45) Date of Patent: Mar. 22, 2022

(54) ARRAY SUBSTRATE AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Lin Li, Beijing (CN); Yanbin Xu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 868 days.

(21) Appl. No.: 16/077,527

(22) PCT Filed: Feb. 8, 2018

(86) PCT No.: PCT/CN2018/075737
§ 371 (c)(1),
(2) Date: Aug. 13, 2018

(87) PCT Pub. No.: WO2019/015308
PCT Pub. Date: Jan. 24, 2019

(65) Prior Publication Data
US 2021/0210521 A1    Jul. 8, 2021

(30) Foreign Application Priority Data
Jul. 17, 2017 (CN) .......................... 201710579004.3

(51) Int. Cl.
*H01L 27/12* (2006.01)
*G09G 3/20* (2006.01)

(52) U.S. Cl.
CPC .......... *H01L 27/1244* (2013.01); *G09G 3/20* (2013.01); *G09G 2300/0426* (2013.01)

(58) Field of Classification Search
CPC ................. H01L 27/1244; G09G 3/20; G09G 2300/0426
(Continued)

(56) References Cited

U.S. PATENT DOCUMENTS

2002/0113934 A1    8/2002  Aoki
2010/0103354 A1    4/2010  Yu et al.
(Continued)

FOREIGN PATENT DOCUMENTS

CN    103022047 A    4/2013
CN    204481026 U    7/2015
(Continued)

OTHER PUBLICATIONS

First Office Action for Chinese Patent Application No. 201710579004.3 dated Apr. 2, 2020.
(Continued)

*Primary Examiner* — Kwin Xie
(74) *Attorney, Agent, or Firm* — Calfee, Halter & Griswold LLP

(57) ABSTRACT

The present disclosure provides an array substrate, which includes a first signal line and a second signal line arranged on a substrate as different layers that are insulating and spaced apart from each other, wherein one end of the first signal line includes a first conductive section, one end of the second signal line includes a second conductive section, the first conductive section and the second conductive section are electrically connected through a connecting structure, and wherein orthographic projections of an area where the first conductive section is located and an area where the second conductive section is located overlap at least partially. The array substrate can reduce the possibility of occurrence of circuit break between signal lines and improve the effect of connection between different signal lines.

18 Claims, 4 Drawing Sheets

C-C

(58) Field of Classification Search
USPC .......................................................... 257/79
See application file for complete search history.

(56) References Cited

U.S. PATENT DOCUMENTS

| | | | |
|---|---|---|---|
| 2013/0076601 A1 | 3/2013 | Wang et al. | |
| 2015/0028340 A1* | 1/2015 | Iwasaka | H01L 27/1288 257/72 |
| 2015/0270251 A1 | 9/2015 | Nagami | |
| 2015/0311232 A1* | 10/2015 | Sun | H01L 27/124 257/72 |
| 2015/0346565 A1* | 12/2015 | Okumoto | G02F 1/13452 257/72 |
| 2016/0103378 A1* | 4/2016 | Hashiguchi | G02F 1/136286 349/43 |
| 2017/0117298 A1* | 4/2017 | Cha | H01L 29/24 |
| 2017/0154896 A1 | 6/2017 | Li et al. | |
| 2017/0177125 A1* | 6/2017 | Kim | G06F 3/0412 |
| 2017/0184895 A1 | 6/2017 | Xu et al. | |
| 2017/0185194 A1* | 6/2017 | Kim | G06F 3/0412 |
| 2017/0185196 A1* | 6/2017 | Kim | G06F 3/0418 |
| 2018/0267375 A1 | 9/2018 | Jiang et al. | |

FOREIGN PATENT DOCUMENTS

| | | |
|---|---|---|
| CN | 105093736 A | 11/2015 |
| CN | 105607361 | 5/2016 |
| CN | 106462018 A | 2/2017 |
| CN | 106681036 A | 5/2017 |
| KR | 20130026375 A | 3/2013 |

OTHER PUBLICATIONS

Search Report from European Application No. 18749279.8 dated Feb. 17, 2021.
Search Report from European Application No. 18794279.8 dated Feb. 17, 2021.
Search Report and Written Opinion for International Application No. PCT/CN2018/075737 dated May 7, 2018.

* cited by examiner

A-A

B-B

C-C

ARRAY SUBSTRATE AND DISPLAY DEVICE

RELATED APPLICATION

The present application is the U.S. national phase entry of PCT/CN2018/075737, with an international filing date of Feb. 8, 2018, which claims the benefit of Chinese Patent Application CN201710579004.3 filed on Jul. 17, 2017, the entire disclosures of which are incorporated herein by reference.

TECHNICAL FIELD

The present disclosure relates to the technical field of display technologies, in particular to an array substrate and a display device.

BACKGROUND

When manufacturing a display device, in order to realize an electrical connection between signal lines of different layers, transfer structures are usually arranged around the display panel, i.e. via holes are formed on insulating layers between two layers of signal lines, then connecting structures like indium tin oxide (ITO) are used to connect the two layers of signal lines. The design of the transfer location will directly influence the quality of electrical connection.

SUMMARY

The present disclosure proposes an array substrate and a display device to solve one or more problems in the prior art.

According to an aspect of the present disclosure, an array substrate is provided, which comprises a first signal line and a second signal line arranged on a substrate as different layers that are insulating and spaced apart from each other, wherein one end of the first signal line comprises a first conductive section, one end of the second signal line comprises a second conductive section, the first conductive section and the second conductive section are electrically connected through a connecting structure, and wherein orthographic projections of an area where the first conductive section is located and an area where the second conductive section is located overlap at least partially.

Alternatively, the second conductive section is located at a side of the first conductive section facing away from the substrate, an insulating layer is arranged between a layer where the first conductive section is located and a layer where the second conductive section is located, and a passivation layer is arranged on a side of the second conductive section facing away from the substrate; and wherein, the connecting structure is connected to the first conductive section through at least one first via hole that penetrates both the passivation layer and the insulating layer, and is connected to the second conductive section through at least one second via hole that penetrates the passivation layer.

Alternatively, there are a plurality of first via holes and second via holes, and the plurality of first via holes correspond one to one to the plurality of second via holes.

Alternatively, orthographic projections of the first conductive section and the second conductive section on the substrate overlap at least partially.

Alternatively, an orthographic projection of each of the plurality of second via holes on the substrate is within the range of the orthographic projection of the second conductive section on the substrate, an orthographic projection of each of the plurality of first via holes on the substrate is outside of the range of the orthographic projection of the second conductive section on the substrate, and the orthographic projection of each first via hole is adjacent to but not overlapping with the orthographic projection of the corresponding second via hole.

Alternatively, the second conductive section comprises at least one slit penetrating through it, an orthographic projection of at least one of the first via holes on the substrate is within the range of an orthographic projection of the at least one slit on the substrate, an orthographic projection of a second via hole corresponding to the at least one of the first via holes on the substrate is outside of the range of the orthographic projection of the at least one slit on the substrate, and the orthographic projection of each first via hole is adjacent to but not overlapping with the orthographic projection of the corresponding second via hole.

Alternatively, the orthographic projection of each of the at least one slit on the substrate is a rectangle.

Alternatively, the second conductive section comprises a plurality of slits penetrating through it, and orthographic projections of the plurality of slits on the substrate cover the orthographic projections of the plurality of first via holes on the substrate.

Alternatively, the first conductive section comprises a first comb handle and a plurality of spaced first comb teeth are connected to the first comb handle, and the area where the first conductive section is located is the sum of an area where the first comb handle is located, an area where the plurality of first comb teeth are located and an area where intervals between the plurality of first comb teeth are located; and the second conductive section comprises a second comb handle and a plurality of spaced second comb teeth are connected to the second comb handle, and the area where the second conductive section is located is the sum of an area where the second comb handle is located, an area where the plurality of second comb teeth are located and an area where intervals between the plurality of second comb teeth are located;

wherein, orthographic projections of the plurality of first comb teeth on the substrate and orthographic projections of the plurality of second comb teeth on the substrate are distributed alternately, the orthographic projection of the at least one first via hole on the substrate is within the orthographic projections of the plurality of first comb teeth on the substrate, and the orthographic projection of the at least one second via hole on the substrate is within the orthographic projections of the plurality of second comb teeth on the substrate.

Alternatively, the substrate comprises a display area and a non-display area surrounding the display area, and the first signal line, the first conductive section, the second signal line and the second conductive section are all arranged in the non-display area.

Alternatively, the display area also includes gate lines and data lines that are arranged in different layers, and wherein the first signal line, the first conductive section and the gate lines are arranged in the same layer and made of the same material, and the second signal line, the second conductive section and the data lines are arranged in the same layer and made of the same material.

Alternatively, the display area of the substrate further includes an electrode layer which is arranged at a side of the data lines facing away from the substrate, and the connecting structure and the electrode layer are arranged in the same layer and made of the same material.

Alternatively, the connecting structure is made of a transparent conductive material.

According to another aspect of the present disclosure, a display device is provided, which comprises any of the above-described array substrate.

BRIEF DESCRIPTION OF THE DRAWINGS

The drawings are provided for facilitating further understanding of the present disclosure and they form a part of the description, but they do not intend to limit the present disclosure. In the drawings.

DETAILED DESCRIPTION

The reference signs are listed as follows: 11, 12: signal lines in the technology known by the inventor; 13: connecting structure in the technology known by the inventor; 20: substrate; 21: first signal line; 22: second signal line; 23: first conductive section; 23a: first comb handle; 23b: first tomb teeth; 24: second conductive section; 24a: second comb handle; 24b: second comb teeth; 241: slit; 25: connecting structure in the present disclosure; 26: first via hole; 27: second via hole; 28: insulating layer; 29: passivation layer.

Embodiments of the present disclosure will be described in detail below with reference to the drawings. It shall be understood that the embodiments described herein are only used for illustrating and explaining the present disclosure, but they do not intend to limit the present disclosure.

Figure 1:
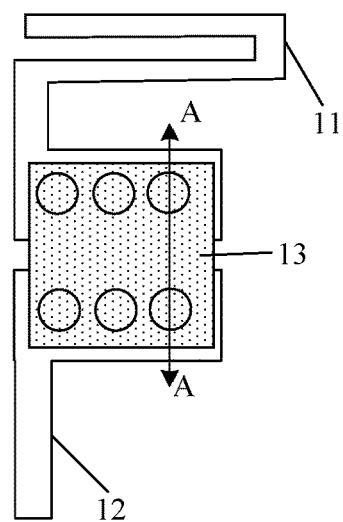
FIG. 1 is a schematic drawing of a connection at a transfer location for two layers of signal lines in the technology known by the inventor.
Figure 2:
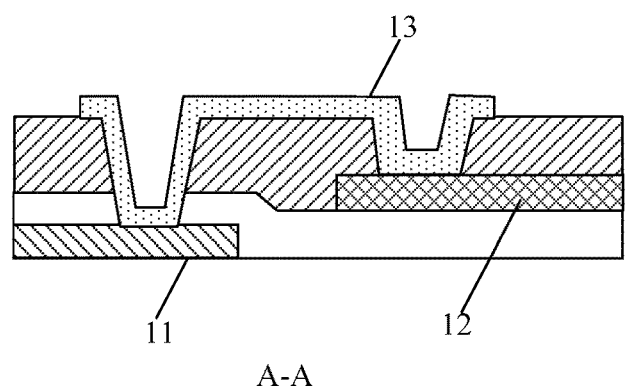
FIG. 2 is a sectional view of FIG. 1 along line A-A.

FIG. 1 is a schematic drawing of a connection at a transfer location for two layers of signal lines in the technology known by the inventor; FIG. 2 is a sectional view of FIG. 1 along line A-A. Since the projections of the two layers of signal lines 11 and 12 on the substrate face but not overlap each other, when electrical signals are loaded on the signal line 11 or 12, a lot of electrostatic charges will be accumulated at the ends of the two signal lines 11 and 12 close to each other. In this case, point discharge is likely to occur, so that electrostatic breakdown occurs at the gap between the two signal lines 11 and 12, resulting beak of the part of the connecting structure 13 at the gap. Once the break occurs, there may be a circuit break between the two signal lines 11 and 12, which will influence signal transmission.

The present disclosure provides an array substrate, as shown in FIGS. 3-9. The array substrate comprises a first signal line 21 and a second signal line 22 arranged on the substrate 20 as different layers that are insulating and spaced apart from each other. One end of the first signal line 21 comprises a first conductive section 23, one end of the second signal line 22 comprises a second conductive section 24. The first conductive section 23 and the second conductive section 24 are electrically connected through a connecting structure 25, and orthographic projections of an area where the first conductive section 23 is located and an area where the second conductive section 24 is located overlap at least partially. The first conductive section 23 and the first signal line 21 can be an integral structure, and the second conductive section 24 and the second signal line 22 can be an integral structure.

The area where the first conductive section 23 is located can be determined as a rectangular area formed by using a maximum size of the first conductive section 23 along a length direction of the substrate 20 as the length of the rectangular area and using a maximum size of the first conductive section 23 along a width direction of the substrate 20 as the width of the rectangular area; the area where the second conductive section 24 is located can be considered as a rectangular area formed by using a maximum size of the second conductive section 24 along the length direction of the substrate 20 as the length of the rectangular area and using a maximum size of the second conductive section 24 along the width direction of the substrate 20 as the width of the rectangular area.

In the present disclosure, the area where the first conductive section 23 is located overlapping the area where the second conductive section 24 is located includes two circumstances: (1) orthographic projections of the first conductive section 23 and the second conductive section 24 on the substrate 20 overlap, which can prevent the tips from facing each other, thereby preventing the electrostatic breakdown caused by the point discharge and reducing the possibility of breakage of the connecting structure 25; (2) the first conductive section 23 and the second conductive section 24 each comprises a plurality of conductive parts, wherein when the orthographic projections of the conductive parts of the first conductive section 23 and the conductive parts of the second conductive section 24 on the substrate overlap, the tips will not be facing each other, and when the orthographic projections of the conductive parts of the first conductive section 23 and the conductive parts of the second conductive section 24 on the substrate do not overlap, even if one conductive part of the first conductive section 23 is disconnected from one conductive part of the second conductive section 24, the rest of the conductive parts of the first conductive section 23 are still connected to the rest of the conductive parts of the second conductive section 24, thereby reducing the possibility that the first conductive section 23 is completely disconnected from the second conductive section 24. It can be seen that in either case, disconnection of the first conductive section 23 from the second conductive section 24 because of the point discharge can be reduced, thereby ensuring electrical connection between the first signal line 21 and the second signal line 22.

Figure 4:
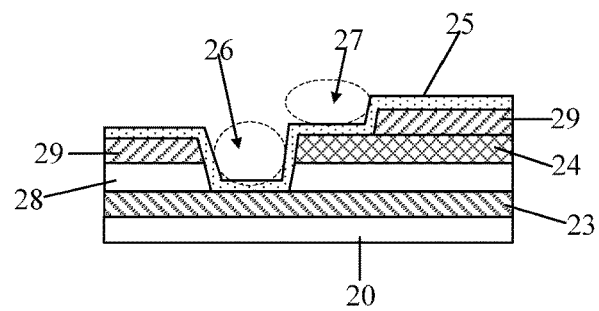
FIG. 4 is a sectional view of FIG. 3 along line B-B.
Figure 6:
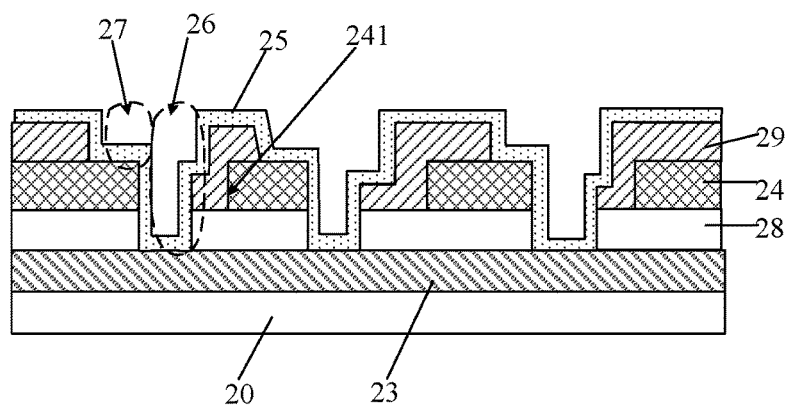
FIG. 6 is a sectional view of FIG. 5 along line C-C.
Figure 9:
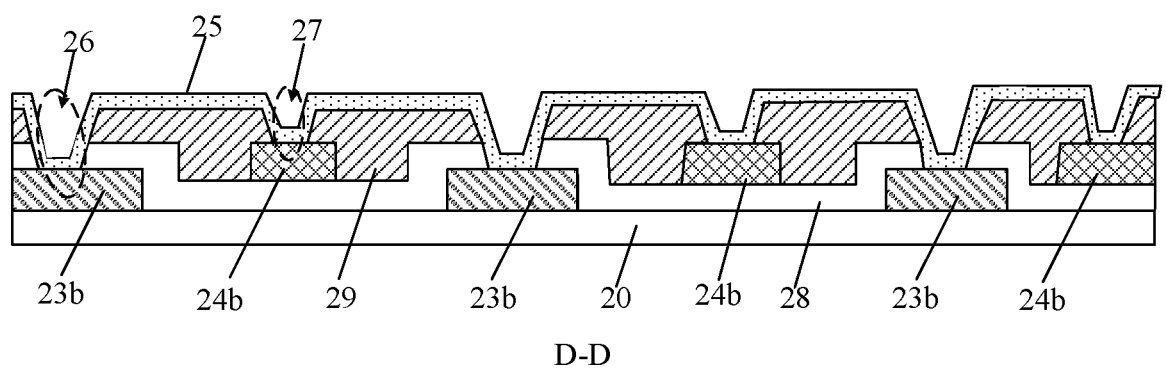
FIG. 9 is a sectional view of FIG. 8 along line D-D.

As shown in FIGS. 4, 6 and 9, the second conductive section 24 is at a side of the first conductive section 23 facing away from the substrate, an insulating layer 28 is arranged between a layer where the first conductive section 23 is located and a layer where the second conductive section 24 is located, and a passivation layer 29 is arranged on a side of the second conductive section 24 facing away from the substrate. The connecting structure 25 is connected to the first conductive section 23 through at least one first via hole 26 that penetrates both the passivation layer 29 and the insulating layer 28, and is connected to the second conductive section 24 through at least one second via hole 27 that penetrates the passivation layer 29. Generally speaking, a depth of the first via hole in a direction perpendicular to the substrate is greater than a depth of the second via hole in the direction perpendicular to the substrate. The connecting structure 25 can be made of a transparent conductive material, such as indium tin oxide (ITO), etc. It shall be pointed out that in this text, the layer where the second conductive section is located refers to a pattern formed in the same film forming process as the second conductive section and the second signal line, and the term "penetrate" used in this text refers to passing through in the direction perpendicular to the substrate.

Alternatively, there are a plurality of first via holes 26 and a plurality of second via holes 27 so as to increase contact areas between the connecting structure 25 and the first conductive section 23 and second conductive section 24. In order to facilitate forming the plurality of first via holes 26 and the plurality of second via holes 27, the width of the first conductive section 23 can be made to be greater than the width of the first signal line 21, and the width of the second conductive section 24 greater than the width of the second signal line 22. In this case, the first via holes 26 and the second via holes 27 can correspond one to one.

The technical solution of the present disclosure can particularly be applied to transfer around the display area of the array substrate. Specifically, the substrate 20 comprises a display area and a non-display area surrounding the display area, and the first signal line 21, the first conductive section 23, the second signal line 22 and the second conductive section 24 are all arranged in the non-display area. The first signal line 21 can be connected to gate lines in the display area, and the second signal line 22 can be connected to a drive circuit so as to provide scan signals to the gate lines. Of course, the first signal line 21 and the second signal line 22 can also be used for transmission of other signals. Several specific ways of connection between the first conductive section 23 and the second conductive section 24 will be introduced below with reference to FIGS. 3-9.

In FIGS. 3-6, the orthographic projection of the first conductive section 23 on the substrate 20 and the orthographic projection of the second conductive section 24 on the substrate 20 overlap at least partially. Namely, the conductive bodies of the first conductive section 23 and the second conductive section 24 overlap at least partially, thereby preventing the tips from facing each other and preventing point discharge, as a result, breakage of the connecting structure caused by point discharge can be avoided.

Figure 3:
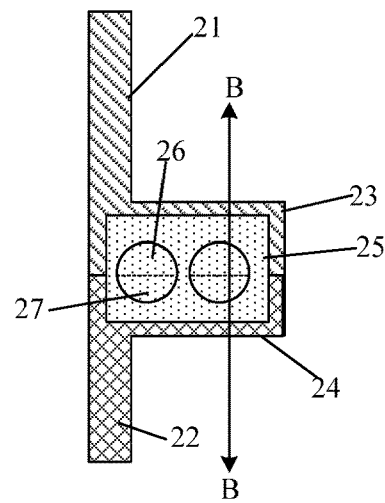
FIG. 3 is a top view of a first way of connection between a first conductive section and a second conductive section provided in an embodiment of the present disclosure.

The first way of connection between the first conductive section 23 and the second conductive section 24 is as shown in FIGS. 3 and 4. One part (about a half) of the orthographic projection of the first conductive section 23 on the substrate 20 is within the range of the orthographic projection of the second conductive section 24 on the substrate 20, while the other part thereof is outside of the range of the orthographic projection of the second conductive section 24 on the substrate 20. The orthographic projection of each second via hole 27 on the substrate 20 is within the range of the orthographic projection of the second conductive section 24 on the substrate 20, the orthographic projection of each first via hole 26 on the substrate 20 is outside of the range of the orthographic projection of the second conductive section 24 on the substrate 20, and the orthographic projection of each first via hole 26 on the substrate 20 is adjacent to but not overlapping with the orthographic projection of the corresponding second via hole 27 on the substrate 20. That is to say, each second via hole 27 is at a side of the edge of the second conductive section 24 facing away from the substrate, and each first via hole 26 is at a side of the first conductive section 23 facing away from the substrate but close to the edge of the second conductive section 24, so that each first via hole 26 is connected to the corresponding second via hole 27 to form a big via hole. The connecting structure 25 can electrically connect the first conductive section 23 and the second conductive section 24 simultaneously through this big via hole. Therefore, compared to the technology known by the inventor, such a way of connection between the first conductive section 23 and the second conductive section 24 can increase the effective conductive area within the same area, thereby ensuring good conductivity.

Figure 5:
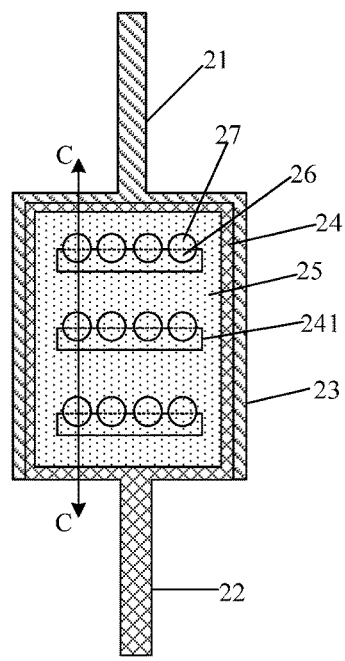
FIG. 5 is a top view of a second way of connection between the first conductive section and the second conductive section provided in some embodiments of the present disclosure.

The second way of connection between the first conductive section 23 and the second conductive section 24 is as shown in FIGS. 5 and 6. A major part or all of the orthographic projection of the first conductive section 23 on the substrate 20 is within the range of the orthographic projection of the second conductive section 24 on the substrate 20. At least one slit 241 penetrating the second conductive section 24 is formed on the second conductive section 24. The orthographic projection of at least one of the first via holes 26 on the substrate 20 is within the range of the orthographic projection of the at least one slit 241 on the substrate 20, while the orthographic projection of the second via hole 27 corresponds to the at least one of the first via holes on the substrate is outside of the range of the orthographic projection of the at least one slit 241 on the substrate 20, and the orthographic projection of each first via hole 26 on the substrate 20 is adjacent to but not overlapping with the orthographic projection of the corresponding second via hole 27 on the substrate 20. Similar to the way shown in FIG. 4, each first via hole 26 is also connected to the corresponding second via hole 27 in FIG. 6, thereby increasing the effective conductive area. Forming the slit 241 on the second conductive section 24 can facilitate forming of the first via hole 26, and the slit 241 can also reduce the overlapping capacitance between the first conductive section 23 and the second conductive section 24.

Figure 7:
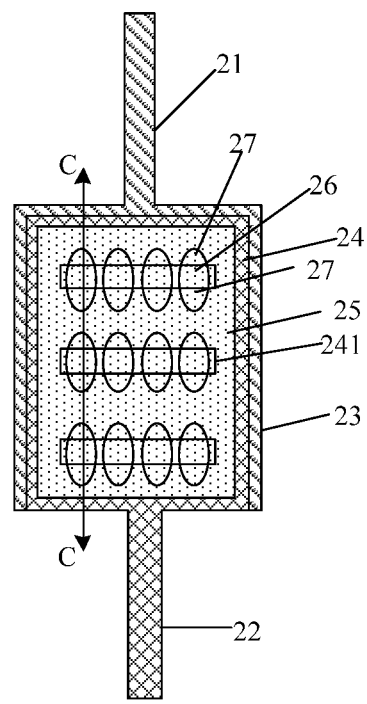
FIG. 7 is a top view of a second way of connection between a first conductive section and a second conductive section provided in some embodiments of the present disclosure.

It shall be understood that in the way of connection between the first conductive section 23 and the second conductive section 24, there might be an instance where one first via hole 26 corresponds to two second via holes 27, as shown in FIG. 7. Similar to the way shown in FIG. 6, the orthographic projection of at least one of the first via holes 26 on the substrate 20 is within the range of the orthographic projection of the at least one slit 241 on the substrate 20, while the projections of the two second via holes 27 corresponding to the at least one of the first via holes on the substrate are outside of the range of the orthographic projection of the at least one slit 241 on the substrate 20, and the orthographic projection of each first via hole 26 on the substrate 20 is adjacent to but not overlapping with the orthographic projections of the corresponding two second via holes 27 on the substrate 20. Each first via hole 26 is connected to the corresponding two second via holes 27, thereby further increasing the effective conductive area.

In the embodiment of the present disclosure, the shape of the slit 241 is not specifically limited, and the shape shown in FIG. 5 can be used as an example. The orthographic projection of each slit 241 on the substrate 20 can be a rectangle. The orthographic projections of the plurality of slits 241 on the substrate 20 can overlay the orthographic projections of the plurality of first via holes 26 on the substrate 20.

Furthermore, in practical application, in the case where the non-display area has dense wiring and constrained space, the way described in FIG. 3 can be used, and the first via holes 26 and the second via holes 27 can be formed larger. The way described in FIG. 5 can be used if the space of the non-display area allows, so that the first conductive section 23 and the second conductive section 24 have a large area overlapping to facilitate formation of multiple rows and/or multiple columns of first via holes 26 and second via holes 27.

Figure 8:
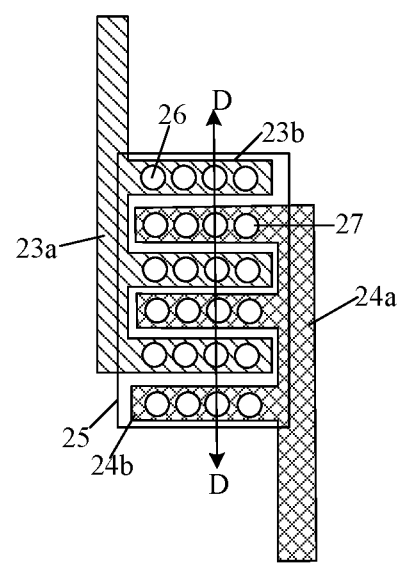
FIG. 8 is a top view of a third way of connection between the first conductive section and the second conductive section provided in an embodiment of the present disclosure.

The third way of connection between the first conductive section 23 and the second conductive section 24 is as shown in FIGS. 8 and 9. In order to clearly show the structures of and connection relation between the first conductive section 23 and the second conductive section 24, the connecting structure 25 is represented by a transparent film layer in FIG. 8 without being filled with a pattern. The first conductive section 23 comprises a first comb handle 23a and a plurality of spaced first comb teeth 23b connected to the first comb handle 23a. The area where the first conductive section 23 is located is the sum of an area where the first comb handle 23 is located, an area where the plurality of first comb teeth 23b are located and an area where intervals between the plurality of first comb teeth 23b are located. The second conductive section 24 comprises a second comb handle 24a and a plurality of spaced second comb teeth 24b connected to the second comb handle 24a. The area where the second conductive section 24 is located is the sum of an area where the second comb handle 24a is located, an area where the plurality of second comb teeth 24b are located and an area where intervals between the plurality of second comb teeth 24b are located. Orthographic projections of the plurality of first comb teeth 23b on the substrate 20 and orthographic projections of the plurality of second comb teeth 24b on the substrate 20 are distributed alternately, the orthographic projection of the first via hole 26 on the substrate 20 is within the orthographic projections of the plurality of first comb teeth 23b on the substrate 20, and the orthographic projection of the second via hole 27 on the substrate 20 is within the orthographic projections of the plurality of second comb teeth 24b on the substrate 20.

Alternatively, the orthographic projections of the plurality of first comb teeth 23b and the plurality of second comb teeth 24b on the substrate 20 can be partially overlapping so as to reduce the damage to the connecting structure 25 caused by point discharge. Of course, the orthographic projections of the plurality of first comb teeth 23b and the plurality of second comb teeth 24b on the substrate 20 can be non-overlapping, in which case even if a part of the connecting structure 25 which is between one first teeth 23b and one corresponding second teeth 24b breaks because of the point discharge, the rest of the first teeth 23b and second teeth 24b are still electrically connected, and the first conductive section 23 and the second conductive section 24 are electrically connected through the first comb handle 23a and the second comb handle 24a, thereby reducing the possibility that the first conductive section 23 is completely disconnected from the second conductive section 24, and avoiding formation of a thick isolated island due to superimposition of two layers at the same time.

The display area of the substrate 20 usually includes gate lines and data lines (not shown) that are arranged in different layers. Under the condition that the first signal line 21, the second signal line 22, the first conductive section 23 and the second conductive section 24 are arranged in the non-display area, the first signal line 21, the first conductive section 23 and the gate lines can be arranged in the same layer, and they can be made of the same material (metals such as copper); the second signal line 22, the second conductive section 24 and the data lines can be arranged in the same layer, and they can be made of the same material (metals such as copper). Therefore, the first signal line 21, the first conductive section 23 and the gate lines can be made in the same patterning process, and the second signal line 22, the second conductive section 24 and the data lines can be made in the same patterning process, thereby simplifying the process.

An electrode layer may also be formed in the display area of the substrate, and the electrode layer is formed on the layer where the data lines are located and at a side of the layer facing away from the substrate. The connecting structure 25 can be arranged in the same layer as the electrode layer and can use the same material as the electrode layer, so that the electrode layer and the connecting structure 25 can be fabricated synchronously to simplify the process. Specifically, the display area may include a plurality of pixel units, each having a thin film transistor arranged therein, and the electrode layer includes pixel electrodes corresponding to the plurality of pixel units one by one. The process of forming the electrode layer and the connecting structure 25 includes: forming a passivation layer 29 covering the display area and the non-display area after forming the data lines, the second conductive section 24 and the second signal lines 22; forming simultaneously pixel electrode via holes corresponding to drains of the thin film transistors, at least one first via hole 26 corresponding to the first conductive section 23, and at least one second via hole 27 corresponding to the second conductive section 24 through a photolithographic process; then forming a transparent conductive material layer and subjecting said transparent conductive material layer to the photolithographic process to form a pattern including the pixel electrodes and the connecting structure 25.

An embodiment of the present disclosure further provides a display device, which comprises the above-mentioned array substrate. The display device can be any product or component having a display function, such as electronic paper, organic electroluminescent display panel, mobile phone, tablet PC, TV, monitor, laptop, digital photo frame, navigator, etc.

Since the array substrate can reduce the possibility of breakage of the connecting structure owing to point discharge, the display device using such array substrate has better signal transmission effect and higher display quality.

It shall be appreciated that the above embodiments are merely exemplary embodiments given for illustrating the principle of the present disclosure, but the present disclosure is not limited to them. To those ordinarily skilled in the art, various modifications and improvements can be made without departing from the spirit and essence of the present disclosure, so these modifications and improvements shall be deemed as falling into the protection scope of the present disclosure.

The invention claimed is:

1. An array substrate comprising a first signal line and a second signal line arranged on a substrate as different layers that are insulating and spaced apart from each other, wherein one end of the first signal line comprises a first conductive section, one end of the second signal line comprises a second conductive section, the first conductive section and the second conductive section are electrically connected through a connecting structure, and wherein orthographic projections of an area where the first conductive section is located and an area where the second conductive section is located overlap at least partially;

wherein the second conductive section is located at a side of the first conductive section facing away from the substrate, an insulating layer is arranged between a layer where the first conductive section is located and a layer where the second conductive section is located, and a passivation layer is arranged on a side of the second conductive section facing away from the substrate; and wherein, the connecting structure is connected to the first conductive section through at least one first via hole that penetrates both the passivation layer and the insulating layer, and is connected to the second conductive section through at least one second via hole that penetrates the passivation layer;

wherein the first conductive section comprises a first comb handle and a plurality of spaced first comb teeth are connected to the first comb handle, and the area where the first conductive section is located is the sum of an area where the first comb handle is located, an area where the plurality of first comb teeth are located and an area where intervals between the plurality of first comb teeth are located; and the second conductive section comprises a second comb handle and a plurality of spaced second comb teeth are connected to the second comb handle, and the area where the second conductive section is located is the sum of an area where the second comb handle is located, an area where the plurality of second comb teeth are located and an area where intervals between the plurality of second comb teeth are located;

wherein, orthographic projections of the plurality of first comb teeth on the substrate and orthographic projections of the plurality of second comb teeth on the substrate are distributed alternately, the orthographic projection of the at least one first via hole on the substrate is within the orthographic projections of the plurality of first comb teeth on the substrate, and the orthographic projection of the at least one second via hole on the substrate is within the orthographic projections of the plurality of second comb teeth on the substrate.

2. The array substrate according to claim 1, wherein there are a plurality of first via holes and second via holes, and the plurality of first via holes correspond one to one to the plurality of second via holes.

3. The array substrate according to claim 2, wherein orthographic projections of the first conductive section and the second conductive section on the substrate overlap at least partially.

4. The array substrate according to claim 3, wherein an orthographic projection of each of the plurality of second via holes on the substrate is within the range of the orthographic projection of the second conductive section on the substrate, an orthographic projection of each of the plurality of first via holes on the substrate is outside of the range of the orthographic projection of the second conductive section on the substrate, and the orthographic projection of each first via hole is adjacent to but not overlapping with the orthographic projection of the corresponding second via hole.

5. The array substrate according to claim 3, wherein the second conductive section comprises at least one slit penetrating through it, an orthographic projection of at least one of the first via holes on the substrate is within the range of an orthographic projection of the at least one slit on the substrate, an orthographic projection of a second via hole corresponding to the at least one of the first via holes on the substrate is outside of the range of the orthographic projection of the at least one slit on the substrate, and the orthographic projection of each first via hole is adjacent to but not overlapping with the orthographic projection of the corresponding second via hole.

6. The array substrate according to claim 5, wherein the orthographic projection of each of the at least one slit on the substrate is a rectangle.

7. The array substrate according to claim 5, wherein the second conductive section comprises a plurality of slits penetrating through it, and orthographic projections of the plurality of slits on the substrate cover the orthographic projections of the plurality of first via holes on the substrate.

8. The array substrate according to claim 1, wherein the substrate comprises a display area and a non-display area surrounding the display area, and the first signal line, the first conductive section, the second signal line and the second conductive section are all arranged in the non-display area.

9. The array substrate according to claim 8, wherein the display area also includes gate lines and data lines that are arranged in different layers, and wherein the first signal line, the first conductive section and the gate lines are arranged in the same layer and made of the same material, and the second signal line, the second conductive section and the data lines are arranged in the same layer and made of the same material.

10. The array substrate according to claim 9, wherein the display area of the substrate further includes an electrode layer which is arranged at a side of the data lines facing away from the substrate, and the connecting structure and the electrode layer are arranged in the same layer and made of the same material.

11. The array substrate according to claim 1, wherein the connecting structure is made of a transparent conductive material.

12. A display device comprising the array substrate according to claim 1.

13. The display device according to claim 12, wherein the second conductive section is located at a side of the first conductive section facing away from the substrate, an insulating layer is arranged between a layer where the first conductive section is located and a layer where the second conductive section is located, and a passivation layer is arranged on a side of the second conductive section facing away from the substrate; and wherein, the connecting structure is connected to the first conductive section through at least one first via hole that penetrates both the passivation layer and the insulating layer, and is connected to the second conductive section through at least one second via hole that penetrates the passivation layer.

14. The display device according to claim 13, wherein there are a plurality of first via holes and second via holes, and the plurality of first via holes are corresponding one to one to the plurality of second via holes one by one.

15. The display device according to claim 14, wherein orthographic projections of the first conductive section and the second conductive section on the substrate overlap at least partially.

16. The display device according to claim 15, wherein an orthographic projection of each of the plurality of second via holes on the substrate is within the range of the orthographic projection of the second conductive section on the substrate, an orthographic projection of each of the plurality of first via holes on the substrate is outside of the range of the orthographic projection of the second conductive section on the substrate, and the orthographic projection of each first via hole is adjacent to but not overlapping with the orthographic projection of the corresponding second via hole.

17. The display device according to claim 15, wherein the second conductive section comprises at least one slit penetrating through it, an orthographic projection of at least one of the first via holes on the substrate is within the range of an orthographic projection of the at least one slit on the substrate, an orthographic projection of a second via hole corresponding to the at least one of the first via holes on the substrate is outside of the range of the orthographic projection of the at least one slit on the substrate, and the orthographic projection of each first via hole is adjacent to but not overlapping with the orthographic projection of the corresponding second via hole.

18. The display device according to claim 17, wherein the orthographic projection of each of the at least one slit on the substrate is a rectangle.

* * * * *